(12) United States Patent
Yoshida et al.

(10) Patent No.: US 9,806,147 B2
(45) Date of Patent: Oct. 31, 2017

(54) SEMICONDUCTOR DEVICE

(71) Applicant: Renesas Electronics Corporation, Kawasaki-shi, Kanagawa (JP)

(72) Inventors: Kosuke Yoshida, Kawasaki (JP); Tetsuya Nitta, Kawasaki (JP); Atsushi Sakai, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 121 days.

(21) Appl. No.: 14/403,225

(22) PCT Filed: Jan. 27, 2014

(86) PCT No.: PCT/JP2014/051674
§ 371 (c)(1),
(2) Date: Nov. 24, 2014

(87) PCT Pub. No.: WO2015/111218
PCT Pub. Date: Jul. 30, 2015

(65) Prior Publication Data
US 2016/0181357 A1 Jun. 23, 2016

(51) Int. Cl.
*H01L 29/06* (2006.01)
*H01L 29/78* (2006.01)
(Continued)

(52) U.S. Cl.
CPC ...... *H01L 29/0634* (2013.01); *H01L 29/1095* (2013.01); *H01L 29/7393* (2013.01); *H01L 29/7813* (2013.01); *H01L 29/7816* (2013.01)

(58) Field of Classification Search
CPC ............... H01L 29/7835; H01L 29/407; H01L 29/7816; H01L 21/74; H01L 29/0634;
(Continued)

(56) References Cited

U.S. PATENT DOCUMENTS

| 6,215,138 B1 | 4/2001 | Takao | |
|---|---|---|---|
| 2005/0285188 A1* | 12/2005 | Khemka | ............ H01L 29/7835 257/338 |

(Continued)

FOREIGN PATENT DOCUMENTS

| JP | 11-274490 A | 10/1999 |
|---|---|---|
| JP | 11-307763 A | 11/1999 |
| JP | 2010-016284 A | 1/2010 |

OTHER PUBLICATIONS

Fujihira, Tatsuhiko, "Theory of Semiconductor Superjunction Devices", Jpn. J. Appl. Phys., vol. 36, Part 1, No. 10, Oct. 1997, pp. 6254-6262.

*Primary Examiner* — Bilkis Jahan
*Assistant Examiner* — Victor Barzykin
(74) *Attorney, Agent, or Firm* — Shapiro, Gabor and Rosenberger, PLLC

(57) ABSTRACT

In a semiconductor device, a $p^+$ back gate region (PBG) is arranged in a main surface (S1) between first and second portions (P1, P2) of an $n^+$ source region (SR), and arranged on a side closer to an $n^+$ drain region (DR) with respect to the $n^+$ source region (SR). Thereby, a semiconductor device having a high on-state breakdown voltage can be obtained.

14 Claims, 18 Drawing Sheets

(51) Int. Cl.
*H01L 29/10* (2006.01)
*H01L 29/739* (2006.01)

(58) Field of Classification Search
CPC ............. H01L 29/1095; H01L 29/7393; H01L 29/0692
See application file for complete search history.

(56) References Cited

U.S. PATENT DOCUMENTS

| | | | |
|---|---|---|---|
| 2009/0206402 A1* | 8/2009 | Disney | H01L 29/7817 257/337 |
| 2009/0256212 A1* | 10/2009 | Denison | H01L 29/0653 257/408 |
| 2010/0078724 A1* | 4/2010 | Imoto | H01L 27/0248 257/355 |
| 2012/0217579 A1* | 8/2012 | Huang | H01L 29/0634 257/335 |

* cited by examiner

SEMICONDUCTOR DEVICE

TECHNICAL FIELD

The present invention relates to a semiconductor device.

BACKGROUND ART

Conventionally, high breakdown voltage LDMOSes (Laterally Diffused Metal Oxide Semiconductors) are used. For example, a paper "Theory of Semiconductor Superjunction Devices" (NPD 1) discloses a high breakdown voltage LDMOS having a trench gate structure. This high breakdown voltage LDMOS has a so-called double resurf structure.

Further, Japanese Patent Laying-Open No. 11-307763 (PTD 1) discloses a high breakdown voltage MOSFET (Metal Oxide Semiconductor Field Effect Transistor) having a back gate region structure. In this high breakdown voltage MOSFET, a source region is arranged to face a drain region with a gate electrode sandwiched therebetween, as seen in a plan view. PTD 1 discloses a configuration in which three sides of the source region not facing the gate electrode are surrounded by a back gate region.

CITATION LIST

Patent Document

PTD 1: Japanese Patent Laying-Open No. 11-307763

Non Patent Document

NPD 1: Tatsuhiko Fujihira, "Theory of Semiconductor Superjunction Devices", JJAP, Vol. 36 (1997), pp. 6254 to 6262

SUMMARY OF INVENTION

Technical Problem

In the high breakdown voltage LDMOS having the trench gate structure disclosed in the above paper, during a large current operation, a potential in the vicinity of a channel in a p type body region is increased, and thereby a parasitic bipolar operation occurs. This results in a low on-state breakdown voltage.

Further, in the high breakdown voltage MOSFET disclosed in the above publication, the back gate region is arranged on a side opposite to the drain region with respect to the source region. Thus, an increase in a potential in a p type body region cannot be fully reduced by the back gate region, and a low on-state breakdown voltage is caused by a parasitic bipolar operation.

Other problems and new features will become apparent from the description of the present specification and the accompanying drawings.

Solution to Problem

In a semiconductor device of one embodiment, a back gate region is arranged in a main surface between first and second portions of a first impurity region, and arranged on a side closer to a second impurity region with respect to the first impurity region.

Advantageous Effects of Invention

According to the semiconductor device of one embodiment, an on-state breakdown voltage can be improved.

DESCRIPTION OF EMBODIMENTS

Hereinafter, embodiments will be described based on the drawings.

Embodiment 1

Figure 1:
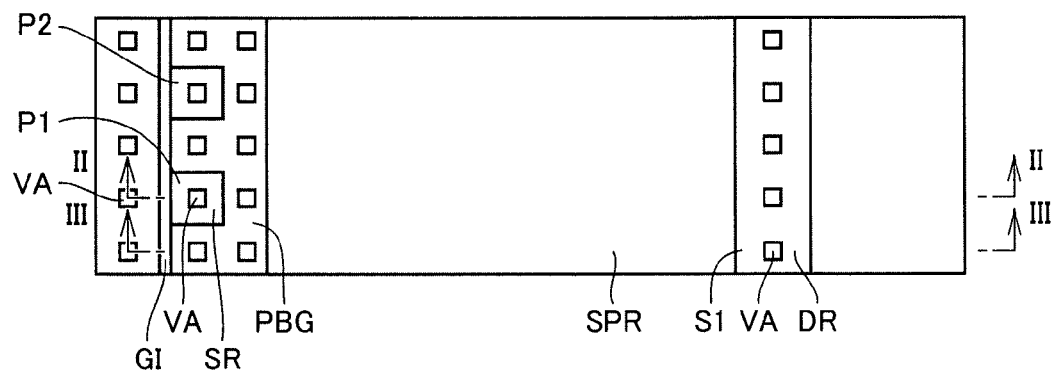
FIG. 1 is a schematic plan view showing a configuration of a semiconductor device of a semiconductor device of Embodiment 1.
Figure 2:
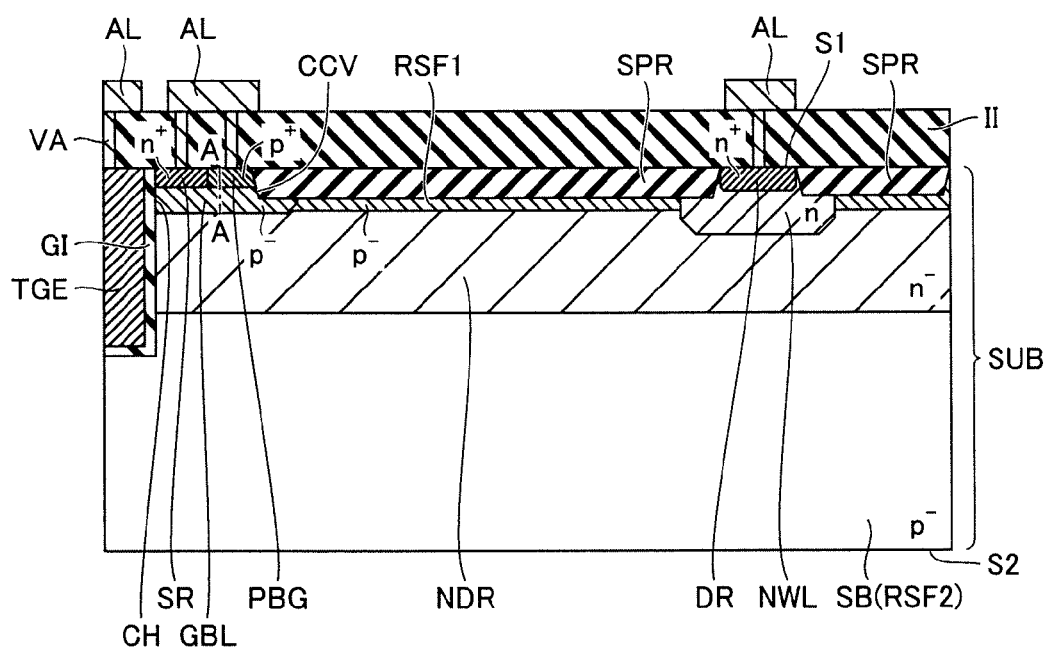
FIG. 2 is a schematic cross sectional view along a line II-II in FIG. 1.
Figure 3:
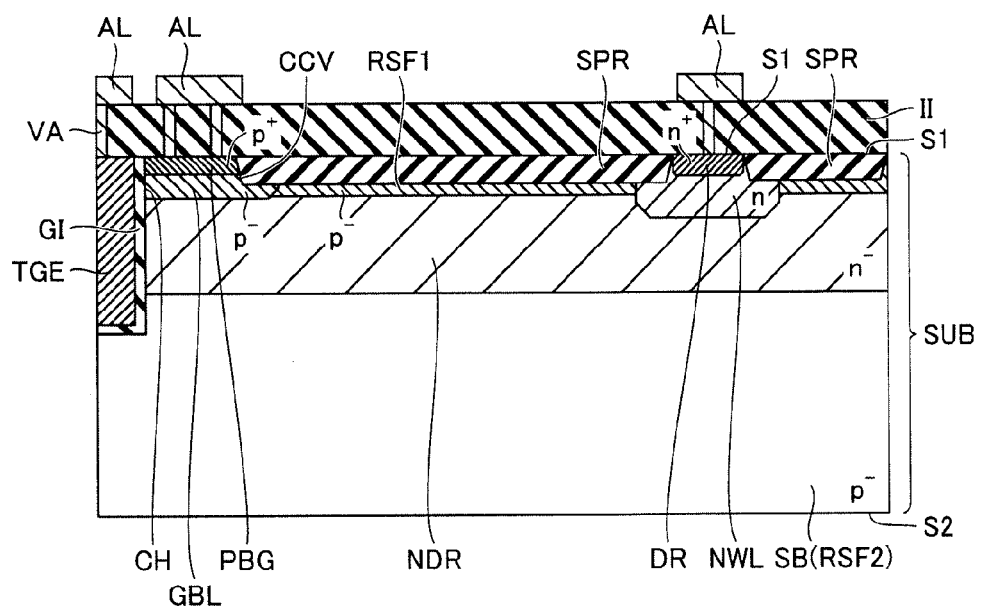
FIG. 3 is a schematic cross sectional view along a line in FIG. 1.

Referring to FIGS. 1 to 3, a semiconductor device of the present embodiment has, for example, an LDMOS transistor portion. It is noted that, in the semiconductor device of the present embodiment, a configuration having a so-called double resurf structure will be described as an example.

This semiconductor device mainly has a semiconductor substrate SUB, a separation insulating film SPR, and a trench gate electrode (a gate electrode) TGE. In semiconductor substrate SUB are formed an $n^-$ drift region (a drift region) NDR, a $p^-$ resurf region (a first resurf region) RSF1, a $p^-$ body region GBL, an $n^+$ source region (a first impurity region of a first conductivity type which serves as a source) SR, a $p^+$ back gate region (a back gate region of a second conductivity type) PBG, an $n^+$ drain region (a second impurity region of the first conductivity type which serves as a drain) DR, and an n type well region NWL.

Semiconductor substrate SUB has a $p^-$ substrate region SB made of, for example, silicon containing a p type impurity. Semiconductor substrate SUB also has one main surface S1 (upper main surface S1 in FIG. 2) and the other main surface S2 (lower main surface S2 in FIG. 2) which are opposite to each other, and a trench (gate trench) CH formed in main surface 1. In FIG. 2, $p^-$ substrate region SB arranged on the other main surface S2 side within semiconductor substrate SUB is arranged as a second resurf region RSF2. Second resurf region RSF2 is a lower resurf region.

$N^-$ drift region NDR containing an n type (the first conductivity type) impurity is formed within semiconductor substrate SUB to be in contact with a side closer to main surface S1 of $p^-$ substrate region SB serving as second resurf region RSF2. Preferably, $n^-$ drift region NDR is formed, for example, to a region about 2 μm deep in a direction from main surface S1 toward main surface S2 of semiconductor substrate SUB. $N^-$ drift region NDR is formed to extend, for example, an almost entire region within semiconductor substrate SUB except for a region where trench gate electrode TGE is formed, relative to a direction along main surface S1 of semiconductor substrate SUB.

$P^-$ resurf region RSF1 of the second conductivity type containing a p type (the second conductivity type) impurity is arranged to be in contact with a side closer to main surface S1 of $n^-$ drift region NDR. $P^-$ resurf region RSF1 constitutes an upper resurf region. Further, $p^-$ substrate region SB serving as second resurf region RSF2 of the second conductivity type is arranged to be in contact with a side of $n^-$ drift region NDR opposite to its side facing $p^-$ resurf region RSF1. Second resurf region RSF2 constitutes the lower resurf region.

$P^-$ resurf region RSF1 is formed to extend, for example, an almost entire region within semiconductor substrate SUB except for regions where trench gate electrode TGE, $p^-$ body region GBL, and n type well region NWL are formed, relative to the direction along main surface S1 of semiconductor substrate SUB.

A concave portion CCV is formed in a portion of main surface S1 of semiconductor substrate SUB, to reach $p^-$ resurf region RSF1. Separation insulating film SPR is made of an insulating film such as a silicon oxide film which fills concave portion CCV.

In a region adjacent to concave portion CCV and separation insulating film SPR relative to the direction along main surface S1 of semiconductor substrate SUB within semiconductor substrate SUB, $p^-$ body region GBL containing the p type impurity is formed to be in contact with the side closer to main surface S1 of $n^-$ drift region NDR. More specifically, $p^-$ body region GBL is formed on the side closer to main surface S1 of $n^-$ drift region NDR to be in contact with an upper surface of $n^-$ drift region NDR, in a region which is not located immediately below separation insulating film SPR and is located at an end portion closer to trench gate electrode TGE of separation insulating film SPR. $P^-$ body region GBL and $n^-$ drift region NDR constitute a pn junction.

Gate trench CH is formed in a region adjacent to $p^-$ body region GBL, of main surface S1 of semiconductor substrate SUB. Gate trench CH extends in a direction intersecting with main surface S1 (for example, in a direction perpendicular to main surface S1) to penetrate regions adjacent to $p^-$ body region GBL and $n^-$ drift region NDR and reach substrate region SB.

A gate insulating film GI made of, for example, a silicon oxide film is formed on the bottom and the side wall of gate trench CH. Trench gate electrode TGE is formed within gate trench CH to be in contact with an upper surface of gate insulating film GI. Trench gate electrode TGE is a gate electrode of the insulated gate field effect transistor portion. Trench gate electrode TGE is embedded within gate trench CH. Trench gate electrode TGE is arranged to face $p^-$ body region GBL with gate insulating film GI interposed therebetween.

$N^+$ source region SR of the first conductivity type and $p^+$ back gate region PBG of the second conductivity type are formed in main surface S1 of semiconductor substrate SUB to be in contact with a side closer to main surface S1 of $p^-$ body region GBL. Therefore, $p^-$ body region GBL is formed below $n^+$ source region SR and $p^+$ back gate region PBG relative to an up-down direction in FIG. 2.

$N^+$ source region SR and $p^+$ back gate region PBG are formed side by side in the direction along main surface S1. $N^+$ source region SR is arranged on a side closer to trench gate electrode TGE (i.e., on the left side in FIG. 1) than $p^+$ back gate region PBG. Further, source region SR and back gate region PBG may be in contact with each other.

N+ source region SR and p− body region GBL constitute a pn junction. N+ source region SR has first and second portions P1, P2 separated from each other along gate trench CH in main surface S1. First and second portions P1, P2 are arranged to be separated from each other in a direction intersecting with a direction in which n+ source region SR and n+ drain region DR face each other along main surface S1. In main surface S1, p+ back gate region PBG is formed between first portion P1 and second portion P2. Further, preferably, a ratio in width between each of first and second portions P1, P2 and p+ back gate region PBG facing trench gate electrode TGE as seen in a plan view is 0.5 to 1:1.

P+ back gate region PBG is arranged in main surface S1 on a side closer to n+ drain region DR with respect to n+ source region SR. That is, in the direction in which n+ source region SR and n+ drain region DR face each other along main surface S1, p+ back gate region PBG is arranged closer to n+ drain region DR than n+ source region SR.

Specifically, p+ back gate region PBG is arranged in main surface S1 around n+ source region SR except for a region where n+ source region SR faces trench gate electrode TGE. That is, in main surface S1, three sides of n+ source region SR not facing trench gate electrode TGE with gate insulating film GI interposed therebetween are surrounded by p+ back gate region PBG.

Figure 4:
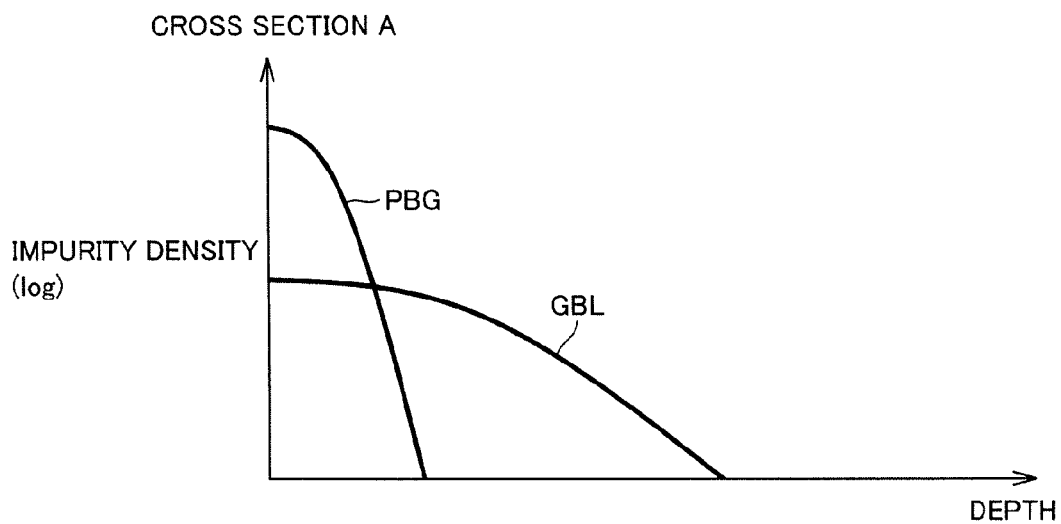
FIG. 4 is a view showing p type impurity density distribution at a cross section A in FIG. 1.

Referring to FIG. 4, impurity density (log) of the p type impurity at a cross section A of semiconductor substrate SUB shown in FIG. 2 decreases with an increase in depth from main surface S1, in both p+ back gate region PBG and p− body region GBL. Further, p+ back gate region PBG has a higher impurity density than p− body region GBL. In the drawing, the depth at a point where lines indicative of impurity densities in p+ back gate region PBG and p− body region GBL intersect with each other indicates a position where p+ back gate region PBG and p− body region GBL are in contact with each other.

N+ drain region DR is arranged in main surface S1 on a side opposite to gate trench CH with respect to n+ source region SR. That is, n+ drain region DR is forming in main surface S1 of semiconductor substrate SUB to be spaced from n+ source region SR and p+ back gate region PBG relative to the direction along main surface S1. In a region between n+ source region SR and n+ drain region DR, separation insulating film SPR extends along main surface S1.

Immediately below n+ drain region DR, n type well region NWL is formed within semiconductor substrate SUB to surround n+ drain region DR planarly (i.e., as seen in a plan view). It is noted that, although n type well region NWL has a shape which extends downward from immediately below drain region DR and spreads at a lower side in the direction along main surface S1 in FIG. 2, n type well region NWL is not limited to have such a shape, and n type well region NWL may be formed, for example, to surround drain region DR in main surface S1. N type well region NWL is a region having a higher n type impurity concentration than n− drift region NDR (i.e., an n region).

N type well region NWL reaches n− drift region NDR and thereby is electrically connected with n− drift region NDR, and allows a current flowing through n− drift region NDR to flow to n+ drain region DR. However, it is preferable to form n type well region NWL to have a bottom portion in a region which is shallower than the lowermost portion of n− drift region NDR, that is, a region closest to the other main surface S2 of n− drift region NDR (i.e., in a region closer to main surface S1). Specifically, n type well region NWL preferably has a depth of about 1 μm, and an n type impurity concentration of more than or equal to $8 \times 10^{16}$ cm$^{-3}$ and less than or equal to $2 \times 10^{17}$ cm$^{-3}$.

An interlayer insulating film II is formed to cover main surface S1 of semiconductor substrate SUB (n+ source region SR, p+ back gate region PBG, and n+ drain region DR), trench gate electrode TGE, gate insulating film GI, and separation insulating film SPR. Interlayer insulating film II is made of, for example, a silicon oxide film. On interlayer insulating film II, a patterned metal wire AL is formed. Metal wire AL is electrically connected to trench gate electrode TGE, n+ source region SR, p+ back gate region PBG, and n+ drain region DR in main surface S1 of semiconductor substrate SUB, through conductive layers called vias VA formed in interlayer insulating film II.

When the LDMOS transistor portion configured as described above is driven, p− body region GBL immediately below n+ source region SR has a field effect due to a voltage applied to adjacent trench gate electrode TGE, and its conductivity type is reversed and an n type channel is formed. Thereby, a path of a current flowing from n+ source region SR to n+ drain region DR through p− body region GBL and n− drift region NDR is formed.

N− drift region NDR, through which the above current flows, has a lower side (i.e., the side closer to the other main surface S2) in contact with p− substrate region SB, and an upper side (i.e., the side closer to main surface S1) in contact with p− resurf region RSF1. That is, the so-called double resurf structure having two pn junctions is formed by n− drift region NDR, and p− substrate region SB and p− resurf region RSF1 joined to sandwich n− drift region NDR from both the upper and lower sides thereof. Thereby, in n− drift region NDR, when a breakdown voltage is maintained, a depletion layer is formed at both of a pn junction portion with p− substrate region SB and a pn junction portion with p− resurf region RSF1, and thus depletion is enhanced more than a normal drift region (for example, having a single pn junction only), and the breakdown voltage between n+ source region SR and n+ drain region DR is improved. Further, since n− drift region NDR is easily depleted, an on-state resistance can be reduced by increasing the n type impurity concentration to be more than that of the normal drift region.

Next, a method for manufacturing the semiconductor device of the present embodiment shown in FIG. 2 will be described with reference to FIGS. 5 to 12.

Figure 5:
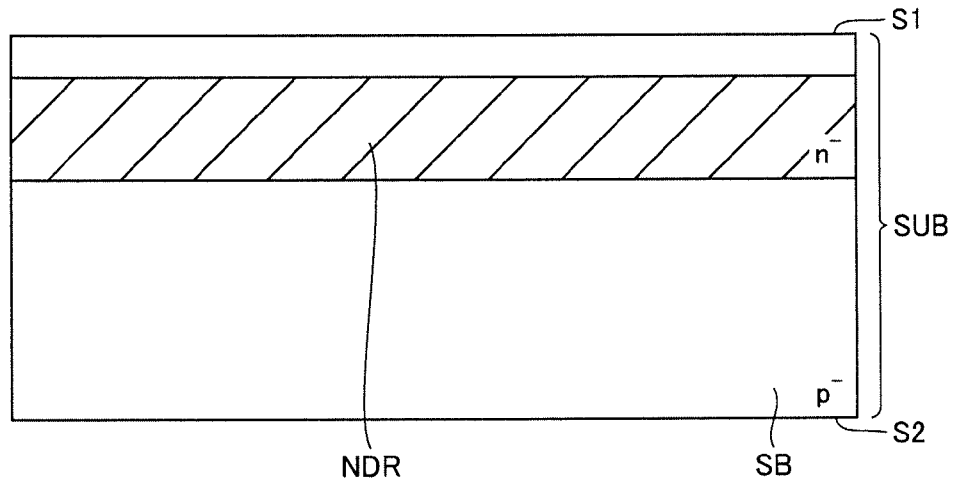
FIG. 5 is a schematic cross sectional view showing a first step of a method for manufacturing the semiconductor device of Embodiment 1.

Referring to FIG. 5, first, semiconductor substrate SUB made of silicon having one main surface S1 and the other main surface S2 facing each other is prepared. Here, semiconductor substrate SUB including p− substrate region SB containing a p type impurity is prepared. From the main surface S1 side of semiconductor substrate SUB, n− drift region NDR is formed within semiconductor substrate SUB, using a normal ion implantation technique. Specifically, for example, impurity ions of phosphorus are implanted into semiconductor substrate SUB in a range where a depth from main surface S1 is about more than or equal to 1 μm and less than or equal to 2 μm. Thereafter, semiconductor substrate SUB is heated to about 1200° C. and subjected to heat treatment for about five hours, for example, to form n− drift region NDR containing impurity ions of phosphorus as an n type impurity in the range where the depth from main surface S1 is about more than or equal to 1 μm and less than or equal to 2 μm.

Figure 6:
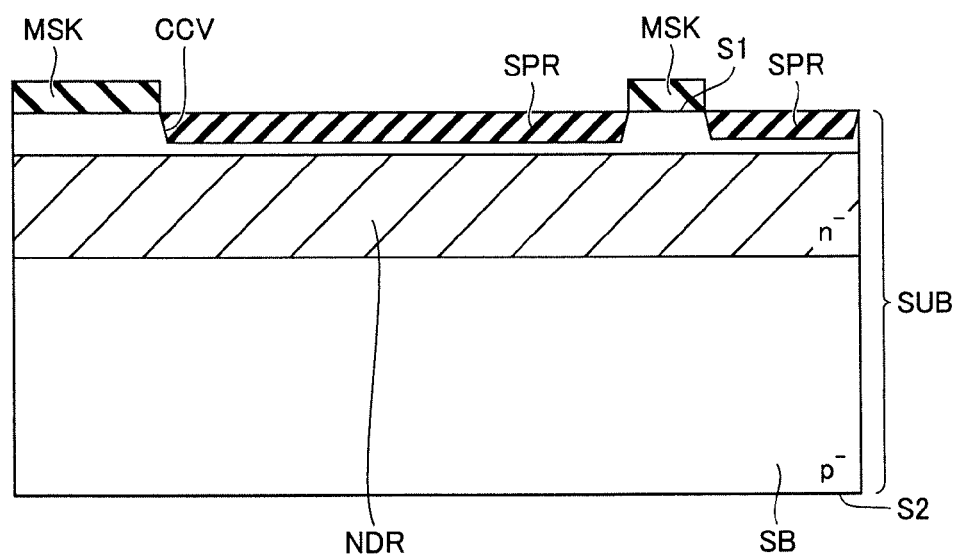
FIG. 6 is a schematic cross sectional view showing a second step of the method for manufacturing the semiconductor device of Embodiment 1.

Referring to FIG. 6, on main surface S1 of semiconductor substrate SUB, a mask pattern MSK made of, for example, a silicon nitride film is formed by normal photolithography technique and etching technique. Using mask pattern MSK as a mask, concave portion CCV is formed in main surface S1 of semiconductor substrate SUB by the normal photolithography technique and etching technique. The bottom portion of concave portion CCV is formed in a region shallower than n$^-$ drift region NDR. To fill concave portion CCV, for example, a silicon oxide film is formed on main surface S1, for example by a normal CVD (Chemical Vapor Deposition) method. Thereafter, the silicon oxide film on main surface S1 is polished, for example, by a chemical mechanical polishing method called CMP (Chemical Mechanical Polishing) to have a flat upper surface, and excess silicon oxide film protruding, for example, outside concave portion CCV is removed. Thereby, separation insulating film SPR is formed within concave portion CCV. After separation insulating film SPR is formed, mask pattern MSK is removed.

Figure 7:
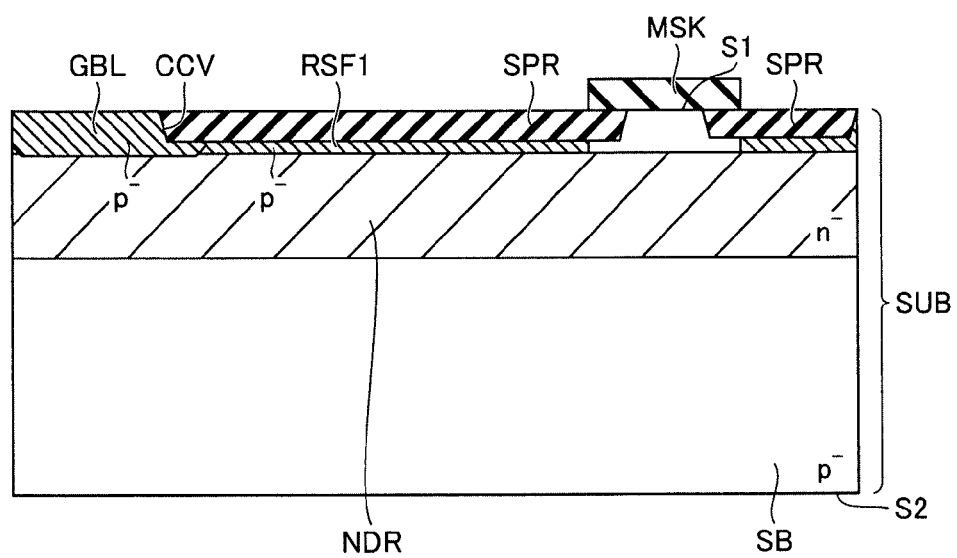
FIG. 7 is a schematic cross sectional view showing a third step of the method for manufacturing the semiconductor device of Embodiment 1.

Referring to FIG. 7, next, mask pattern MSK is formed by the normal photolithography technique to have openings in regions where p$^-$ resurf region RSF1 and p$^-$ body region GBL are to be formed. Using mask pattern MSK as a mask, p type impurity ions are implanted using the normal ion implantation technique, to form p$^-$ resurf region RSF1 and p$^-$ body region GBL within semiconductor substrate SUB. Specifically, for p$^-$ resurf region RSF1, ions are implanted to a range immediately below separation insulating film SPR. Further, p$^-$ body region GBL is formed by multistage ion implantation to extend over separation insulating film SPR with a concentration at which a threshold voltage VT is controlled and punch-through is prevented. After p$^-$ resurf region RSF1 and the like are formed, mask pattern MSK is removed.

Figure 8:
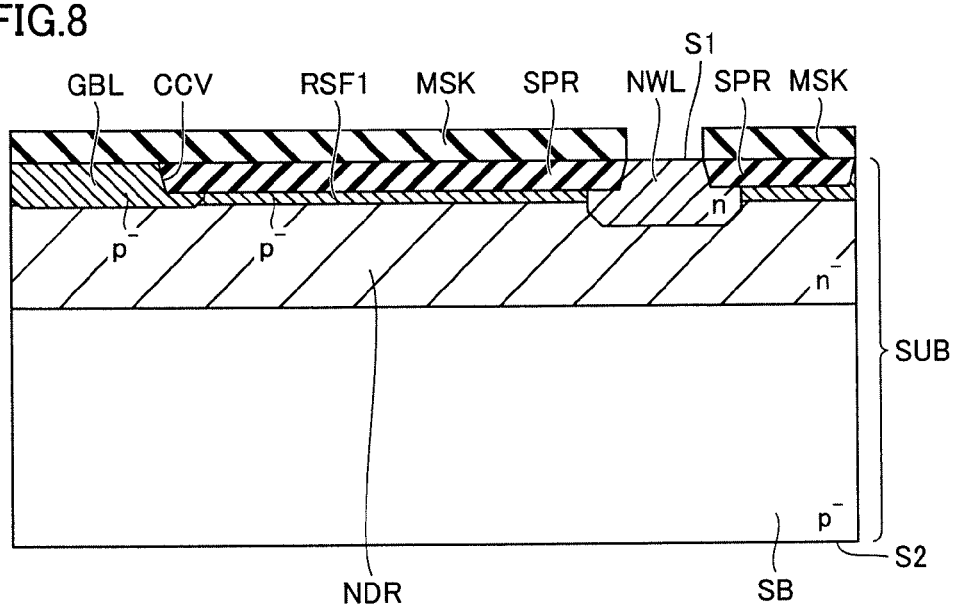
FIG. 8 is a schematic cross sectional view showing a fourth step of the method for manufacturing the semiconductor device of Embodiment 1.

Referring to FIG. 8, next, mask pattern MSK having an opening in a region where n$^-$ drain region DR is to be formed is formed by the normal photolithography technique. Ions of an n type impurity (for example, phosphorus) are implanted by the normal ion implantation technique, to form n type well region NWL. After n type well region NWL is formed, mask pattern MSK is removed. Preferably, n type well region NWL is formed by multistage ion implantation.

Figure 9:
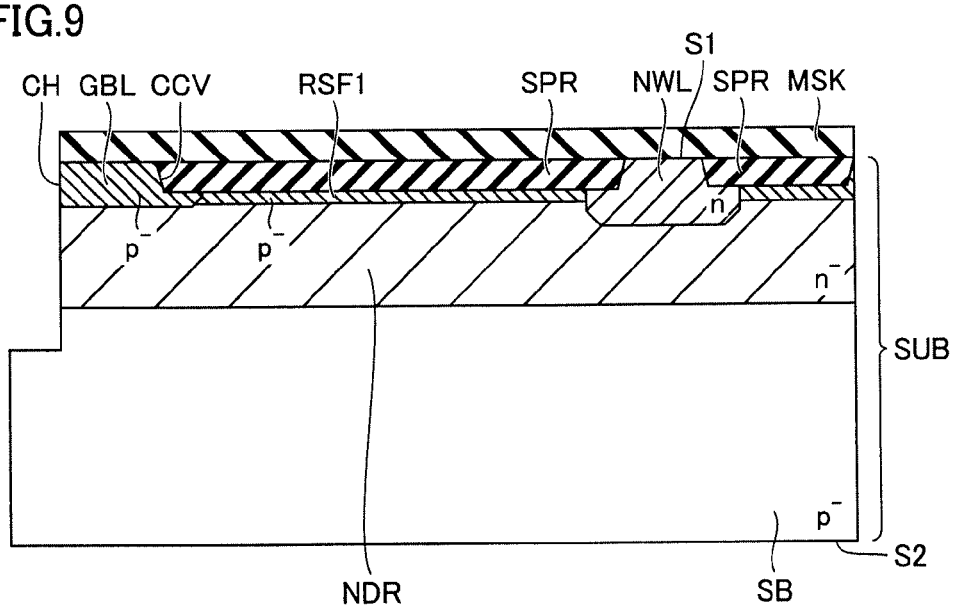
FIG. 9 is a schematic cross sectional view showing a fifth step of the method for manufacturing the semiconductor device of Embodiment 1.

Referring to FIG. 9, next, gate trench CH is formed by the normal photolithography technique and etching technique. Here, gate trench CH extending from main surface S1 in a depth direction is formed to be adjacent to p$^-$ body region GBL. Gate trench CH is formed to reach at least n$^-$ drift region NDR, and in FIG. 9, gate trench CH is formed to penetrate n$^-$ drift region NDR and reach p$^-$ substrate region SB therebelow.

Figure 10:
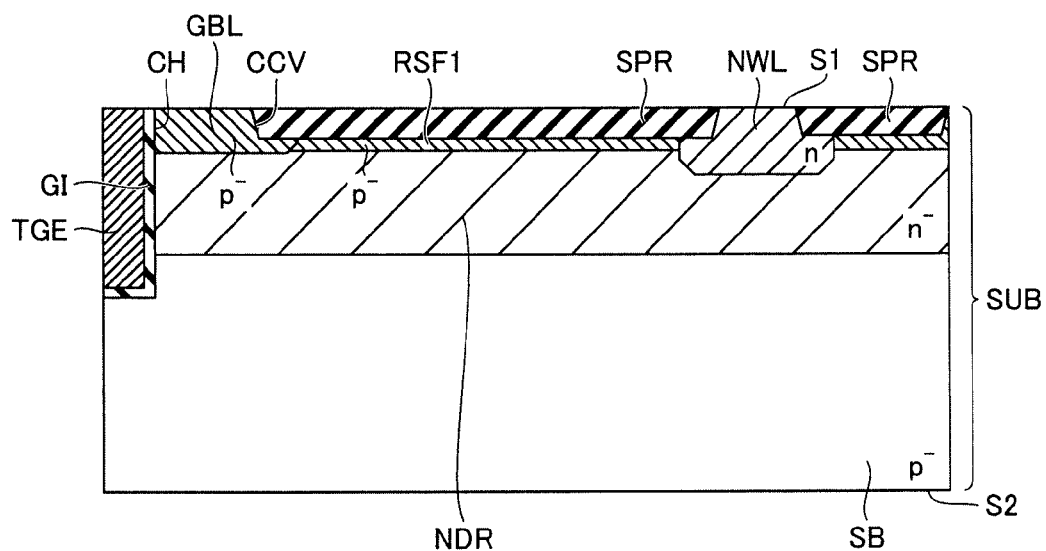
FIG. 10 is a schematic cross sectional view showing a sixth step of the method for manufacturing the semiconductor device of Embodiment 1.

Referring to FIG. 10, next, a silicon oxide film is formed on the bottom and the side wall of gate trench CH by a thermal oxidation treatment method or the like. In this state, for example, a polycrystalline silicon film containing a conductive impurity (DOPOS: DOped POly Silicon) or the like is formed by the normal CVD method to fill gate trench CH. Thereafter, the silicon oxide film and the polycrystalline silicon film or the like described above are etched back, to form gate insulating film GI and trench gate electrode TGE in a manner shown in FIG. 10. Trench gate electrode TGE is formed as a gate electrode of the LDMOS transistor portion.

Figure 11:
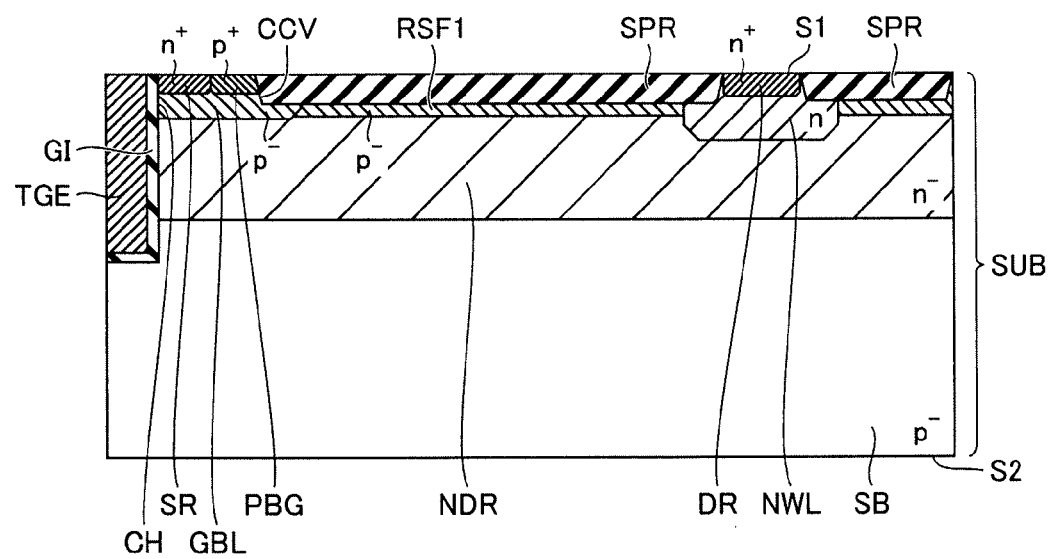
FIG. 11 is a schematic cross sectional view showing a seventh step of the method for manufacturing the semiconductor device of Embodiment 1.

Referring to FIG. 11, using the normal photolithography technique and ion implantation technique, n$^+$ source region SR is formed by implanting n type impurity ions and p$^+$ back gate region PBG is formed by implanting p type impurity ions, in a region immediately above p$^-$ body region GBL of main surface S1 of semiconductor substrate SUB. Similarly, n$^+$ drain region DR is formed by implanting n type impurity ions, in a region immediately above n type well region NWL of main surface S1 of semiconductor substrate SUB.

Figure 12:
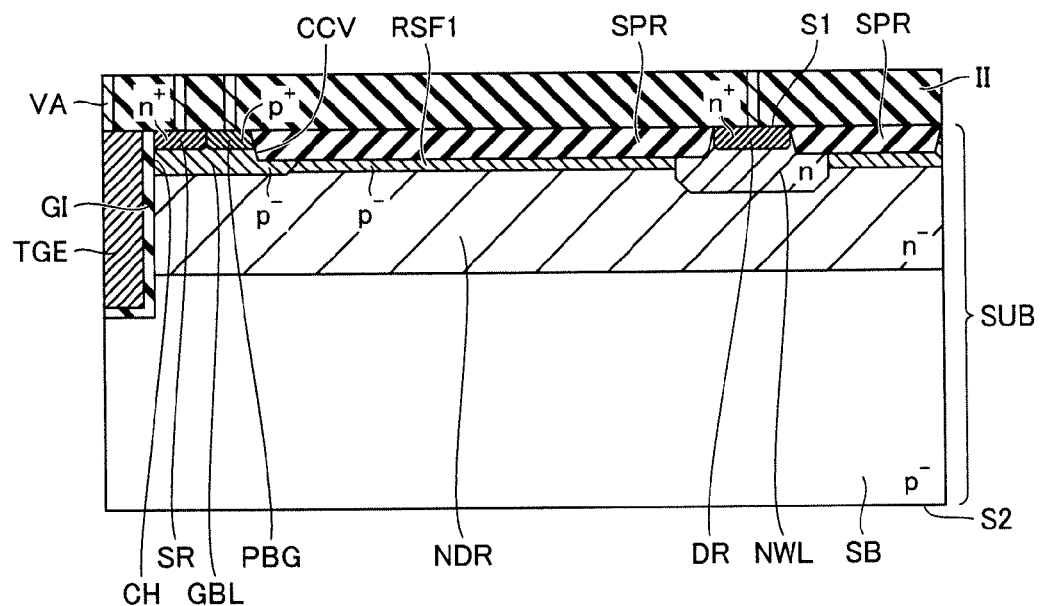
FIG. 12 is a schematic cross sectional view showing an eighth step of the method for manufacturing the semiconductor device of Embodiment 1.

Referring to FIG. 12, on main surface S1 of semiconductor substrate SUB, interlayer insulating film II made of a silicon oxide film is formed for example using the CVD method, and thereafter, interlayer insulating film II is polished by CMP to have a flat upper surface. Further, via holes are formed in interlayer insulating film II by the normal photolithography technique and etching technique, to reach trench gate electrode TGE, n$^+$ source region SR, p$^+$ back gate region PBG, and n$^+$ drain region DR. A conductive layer made of, for example, tungsten is formed within each via hole by, for example, the CVD method, and a thin film of tungsten on interlayer insulating film II is removed by CMP. Thereby, vias VA are formed.

Referring to FIG. 2 again, subsequently, a thin film made of, for example, aluminum is formed on interlayer insulating film II by, for example, sputtering. Then, metal wire AL made of, for example, aluminum is formed by the normal photolithography technique and etching technique. Thereby, the LDMOS transistor portion configured as shown in FIG. 2 is formed.

Next, the function and effect of the present embodiment will be described, as compared with comparative examples. It is noted that, unless otherwise described, semiconductor devices of the comparative examples have configurations substantially identical to the configuration of the semiconductor device of the present embodiment, and thus identical elements will be designated by the same reference numerals and the description thereof will not be repeated.

Figure 13:
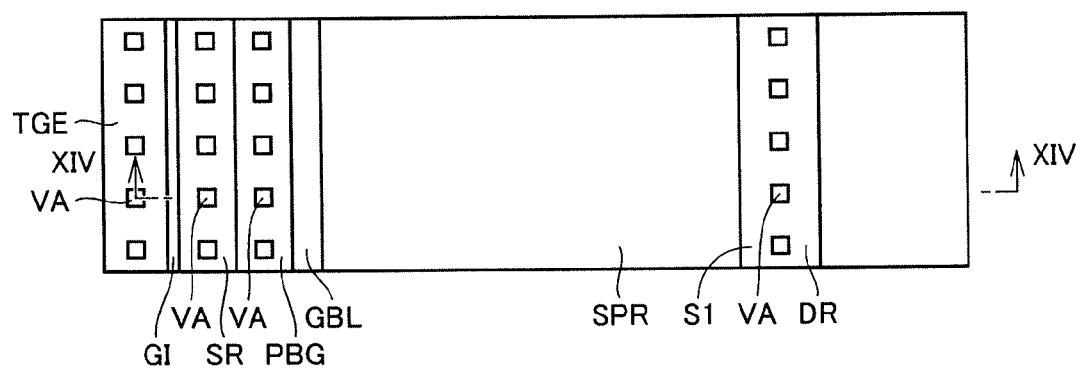
FIG. 13 is a schematic plan view showing a configuration of a semiconductor device of Comparative Example 1.
Figure 14:
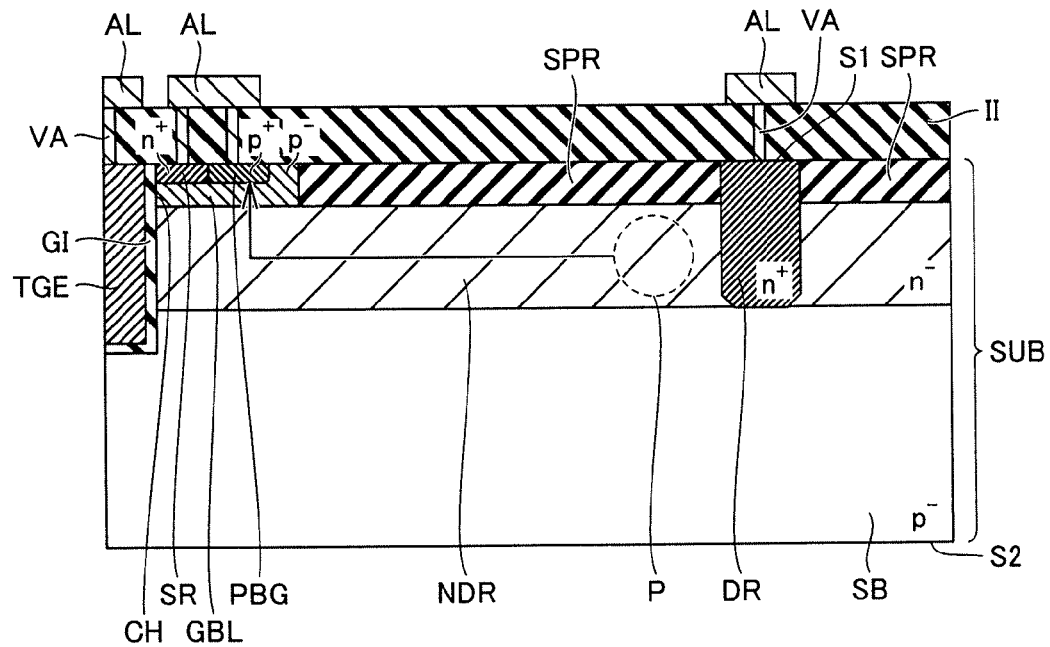
FIG. 14 is a schematic cross sectional view along a line XIV-XIV in FIG. 13.

Referring to FIGS. 13 and 14, a semiconductor device of Comparative Example 1 is different from the semiconductor device of the present embodiment mainly in the configuration of p$^+$ back gate region PBG. In addition, p$^-$ resurf region RSF1 is not formed.

In the semiconductor device of Comparative Example 1, n$^+$ source region SR and p$^+$ back gate region PBG are formed in main surface S1 to extend linearly along trench gate electrode TGE. Further, in main surface S1, p$^+$ back gate region PBG is arranged on a side opposite to trench gate electrode TGE with respect to n$^+$ source region SR.

In the semiconductor device of Comparative Example 1, field intensity is high at an end portion P on a side closer to n$^+$ drain region DR of n$^-$ drift region NDR, and thus impact ionization occurs at end portion P. Thereby, electron-hole pairs are generated. As a result, a hole current caused by these holes is generated as a sub current. This sub current flows out to a GND potential through p$^-$ body region GBL and p$^+$ back gate region PBG.

However, in the semiconductor device of Comparative Example 1, since p$^+$ back gate region PBG is formed linearly along n$^+$ source region SR on the side opposite to trench gate electrode TGE with respect to n$^+$ source region SR, the area of p$^+$ back gate region PBG as seen in a plan view cannot be fully ensured. Accordingly, p$^+$ back gate region PBG cannot fully extract holes. Thus, a potential in p$^-$ body region GBL is increased, and thereby an npn parasitic bipolar operation by n$^+$ source region SR, p$^-$ body region GBL, and n$^-$ drift region NDR occurs. This results in a low on-state breakdown voltage.

Figure 15:
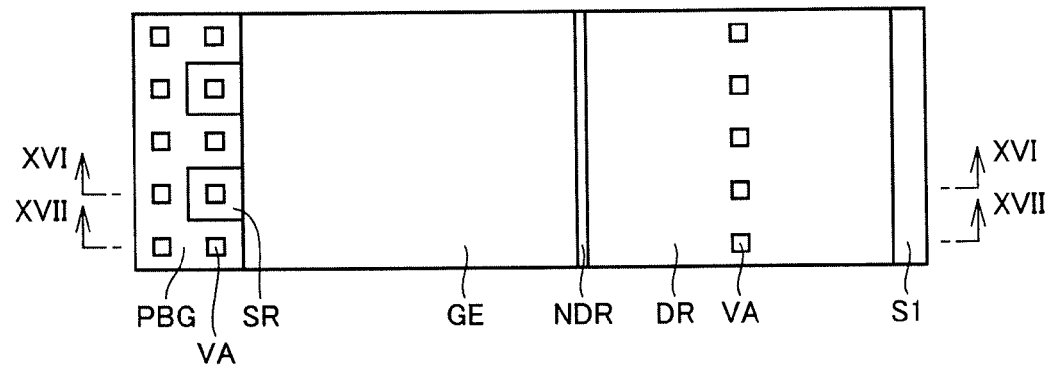
FIG. 15 is a schematic plan view showing a configuration of a semiconductor device of Comparative Example 2.
Figure 16:
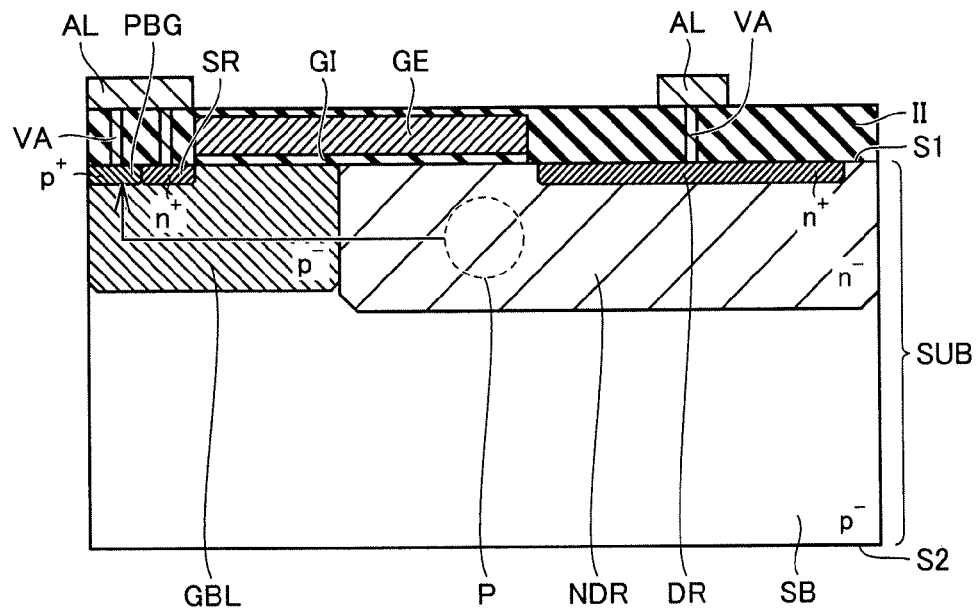
FIG. 16 is a schematic cross sectional view along a line XVI-XVI in FIG. 15.
Figure 17:
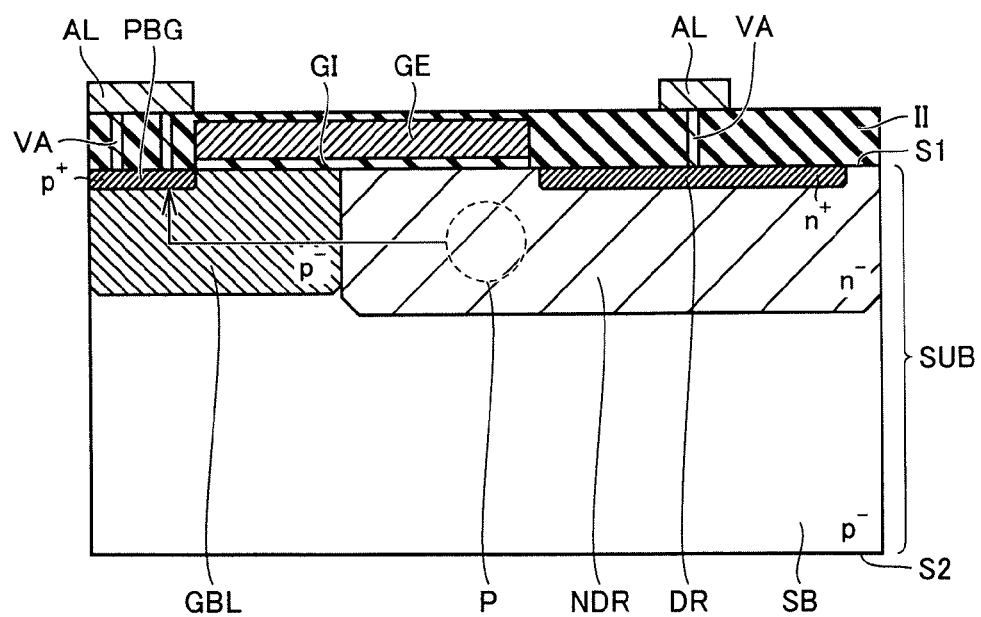
FIG. 17 is a schematic cross sectional view along a line XVII-XVII in FIG. 15.

Subsequently, referring to FIGS. 15 to 17, a semiconductor device of Comparative Example 2 is also different from the semiconductor device of the present embodiment mainly in the configuration of p$^+$ back gate region PBG and the configuration of a gate electrode GE. In addition, p$^-$ resurf region RSF1 is not formed.

In the semiconductor device of Comparative Example 2, as seen in a plan view, $n^+$ source region SR is arranged to face $n^+$ drain region DR with gate electrode GE sandwiched therebetween. Further, as seen in a plan view, three sides of $n^+$ source region SR not facing gate electrode GE are surrounded by $p^+$ back gate region PBG.

Also in the semiconductor device of Comparative Example 2, impact ionization occurs at end portion P on a side closer to $n^+$ drain region DR of $n^-$ drift region NDR, and a sub current flows out to a GND potential through $p^-$ body region GBL and $p^+$ back gate region PBG.

However, in the semiconductor device of Comparative Example 2, $p^+$ back gate region PBG is arranged on a side opposite to $n^+$ drain region DR with respect to $n^+$ source region SR. Thus, a potential in $p^-$ body region GBL tends to be increased, and an npn parasitic bipolar operation by $n^+$ source region SR, $p^-$ body region GBL, and $n^-$ drift region NDR occurs. Since the parasitic bipolar operation cannot be fully reduced by $p^+$ back gate region PBG, this results in a low on-state breakdown voltage.

Figure 18:
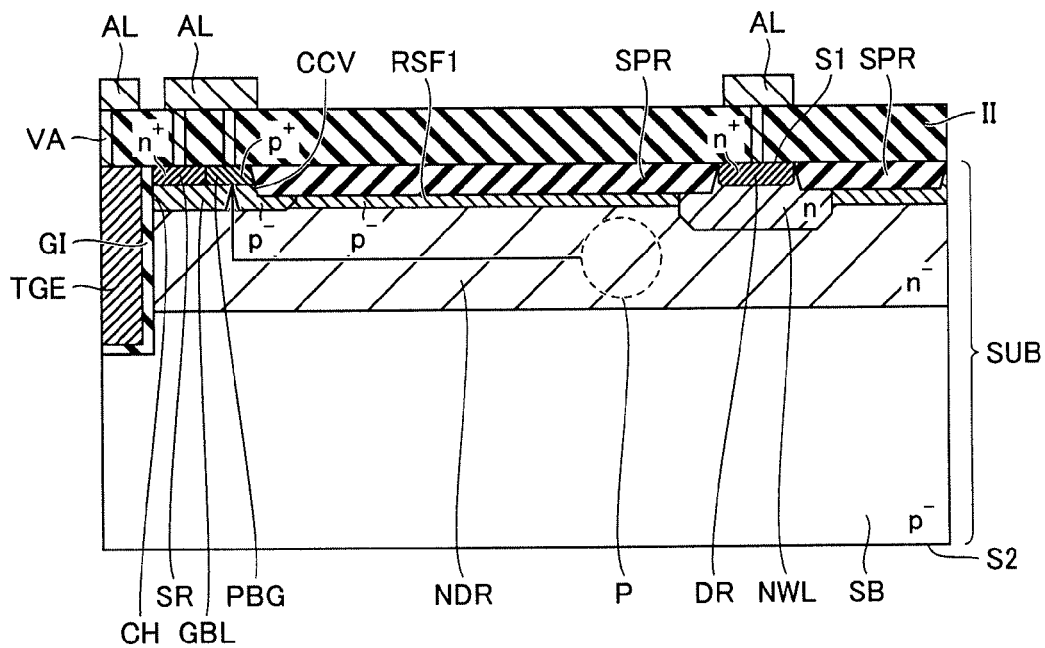
FIG. 18 is a view illustrating the function and effect of the semiconductor device of Embodiment 1, and a schematic cross sectional view corresponding to FIG. 2.
Figure 19:
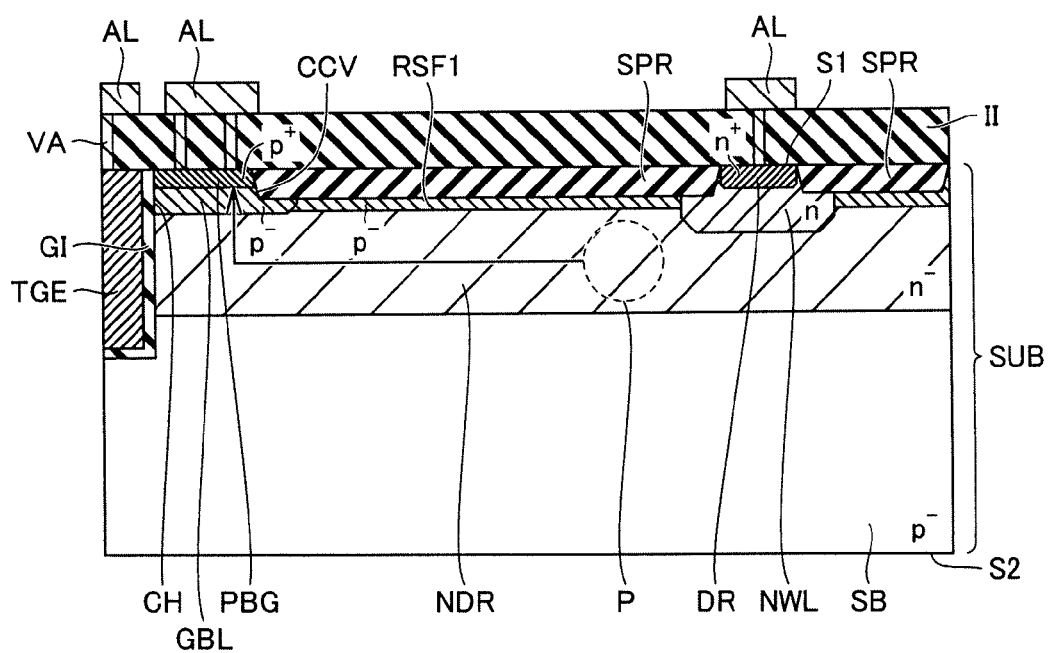
FIG. 19 is a view illustrating the function and effect of the semiconductor device of Embodiment 1, and a schematic cross sectional view corresponding to FIG. 3.

In contrast, referring to FIGS. 1 and 18 to 19, in the semiconductor device of the present embodiment, $p^+$ back gate region PBG is arranged in main surface S1 between first and second portions P1, P2 of $n^+$ source region SR, and arranged on the side closer to $n^+$ drain region DR with respect to $n^+$ source region SR.

Also in the semiconductor device of the present embodiment, impact ionization occurs at end portion P on a side closer to $n^+$ drain region DR of $n^-$ drift region NDR, and a sub current flows out to a GND potential through $p^-$ body region GBL and $p^+$ back gate region PBG. In the semiconductor device of the present embodiment, since $p^+$ back gate region PBG is arranged in main surface S1 between first and second portions P1, P2 of $n^+$ source region SR as shown in FIG. 1, holes can also be extracted from $p^+$ back gate region PBG arranged between first and second portions P1, P2. Further, since $p^+$ back gate region PBG is arranged on the side closer to $n^+$ drain region DR with respect to $n^+$ source region SR, holes can be extracted from $p^+$ back gate region PBG. Accordingly, $p^+$ back gate region PBG can fully extract holes. Since this can suppress an increase in a potential in $p^-$ body region GBL, an npn parasitic bipolar operation by $n^+$ source region SR, $p^-$ body region GBL, and $n^-$ drift region NDR can be suppressed. Thus, an on-state breakdown voltage can be improved by reducing the parasitic bipolar operation by the $p^+$ back gate region.

Further, in the semiconductor device of the present embodiment, as shown in FIG. 2, $p^+$ back gate region PBG is arranged on the side closer to $n^+$ drain region DR with respect to $n^+$ source region SR. Thus, a path of holes flowing from end portion P on the side closer to $n^+$ drain region DR of $n^-$ drift region NDR to $p^+$ back gate region PBG through $p^-$ body region GBL can be shortened. That is, the path of holes in $p^-$ body region GBL can be shortened. Thereby, a resistance by $p^-$ body region GBL can be reduced when the sub current flows, and thus the on-state breakdown voltage can be improved.

Further, in the semiconductor device of the present embodiment, since $p^+$ back gate region PBG is arranged in main surface S1 between first and second portions P1, P2 of $n^+$ source region SR as shown in FIG. 1, a channel width in the trench gate electrode can be reduced. Accordingly, a drain current can be reduced, and thus impact ionization at end portion P on the side closer to $n^+$ drain region DR of $n^-$ drift region NDR can be suppressed. Since this can suppress generation of the sub current, the npn parasitic bipolar operation by $n^+$ source region SR, $p^-$ body region GBL, and $n^-$ drift region NDR can be suppressed. Thus, the on-state breakdown voltage can be improved by reducing the parasitic bipolar operation by the $p^+$ back gate region.

Further, in the semiconductor device of the present embodiment, as shown in FIG. 4, $p^+$ back gate region PBG has a higher impurity density than $p^-$ body region GBL. Thus, $p^+$ back gate region PBG easily extracts holes from $p^-$ body region GBL.

Further, in the semiconductor device of the present embodiment, $p^+$ back gate region PBG is arranged in main surface S1 around $n^+$ source region SR except for the region where $n^+$ source region SR faces trench gate electrode TGE. Thus, the area of $p^+$ back gate region PBG can be increased. Thereby, holes can be fully extracted from $p^+$ back gate region PBG. Accordingly, since an increase in the potential in $p^-$ body region GBL can be fully suppressed, the npn parasitic bipolar operation by $n^+$ source region SR, $p^-$ body region GBL, and $n^-$ drift region NDR can be fully suppressed. Thus, the on-state breakdown voltage can be improved by reducing the parasitic bipolar operation by the $p^+$ back gate region.

Further, in the semiconductor device of the present embodiment, since $p^-$ resurf region RSF1 is arranged to be in contact with the side closer to main surface S1 of $n^-$ drift region NDR, a depletion layer can be formed at the pn junction portion between $n^-$ drift region NDR and $p^-$ resurf region RSF1. Thereby, the breakdown voltage between $n^+$ source region SR and $n^+$ drain region DR can be improved.

Furthermore, in the semiconductor device of the present embodiment, since second resurf region RSF2 is arranged to be in contact with the side of $n^-$ drift region NDR opposite to its side facing $p^-$ resurf region RSF1, a depletion layer can also be formed at the pn junction portion between $n^-$ drift region NDR and $p^-$ substrate region SB. Thereby, the breakdown voltage between $n^+$ source region SR and $n^+$ drain region DR can be further improved.

Next, variations of the present embodiment will be described. In the variations of the present embodiment described below, the layout of contacts is different from that in the present embodiment described above.

Figure 20:
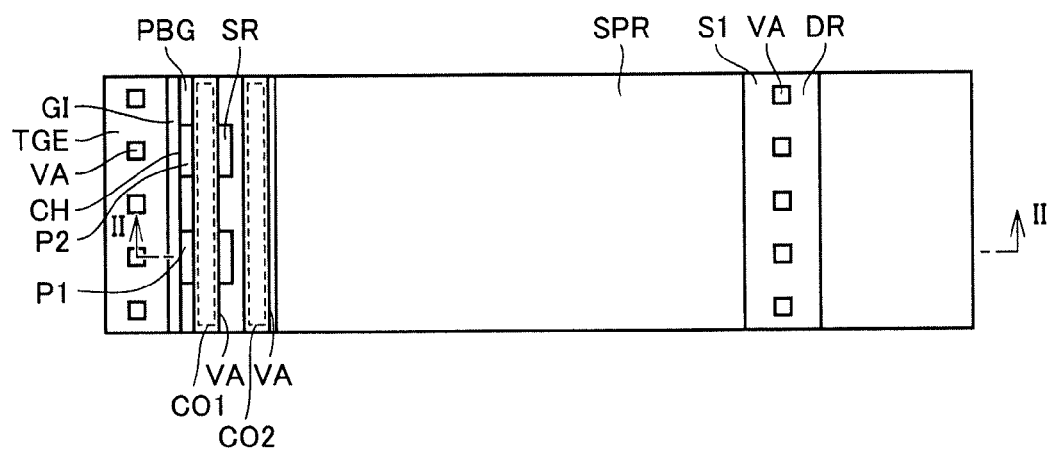
FIG. 20 is a schematic plan view showing a configuration of Variation 1 of the semiconductor device of Embodiment 1.

Referring to FIG. 20, in Variation 1 of the present embodiment, conductive layer (via) VA arranged on main surface S1 and connected to $n^+$ source region SR, and conductive layer (via) VA arranged on main surface S1 and connected to $p^+$ back gate region PBG are each formed like a slit. These conductive layers (vias) VA are arranged in a direction perpendicular to a source-drain direction, side by side to be spaced from each other. It is noted that FIG. 20 is a view corresponding to FIG. 1, and a cross sectional view along a line II-II in FIG. 20 corresponds to FIG. 2.

Conductive layers (vias) VA have a first contact CO1 and a second contact CO2. First contact CO1 is arranged along gate trench CH to extend over first and second portions P1, P2, and connected to first and second portions P1, P2 and $p^+$ back gate region PBG. Second contact CO2 is arranged on $p^+$ back gate region PBG along first contact CO1, on a side opposite to gate trench CH with respect to first contact CO1, and connected onto $p^+$ back gate region PBG.

In Variation 1 of the present embodiment, since each conductive layer VA is formed like a slit, the contact area between conductive layers VA and $n^+$ source region SR and $p^+$ back gate region PBG can be increased. That is, first contact CO1 as a connection portion between conductive layer VA and first and second portions P1, P2 and $p^+$ back gate region PBG, and second contact CO2 as a connection portion between conductive layer VA and $p^+$ back gate region PBG can be increased. Thus, resistances of first and second contacts CO1, CO2 to $n^+$ source region SR and $p^+$ back gate region PBG can be reduced.

Further, the arrangement density of $n^+$ source region SR and $p^+$ back gate region PBG is limited by the arrangement density of conductive layers (vias) VA when they are contact holes, whereas it is not limited by the arrangement density of conductive layers (vias) VA when they are slits.

Figure 21:
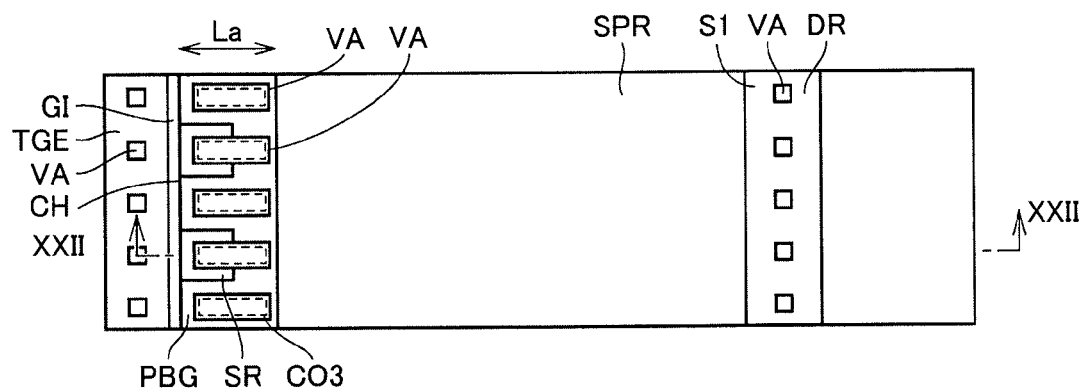
FIG. 21 is a schematic plan view showing a configuration of Variation 2 of the semiconductor device of Embodiment 1.
Figure 22:
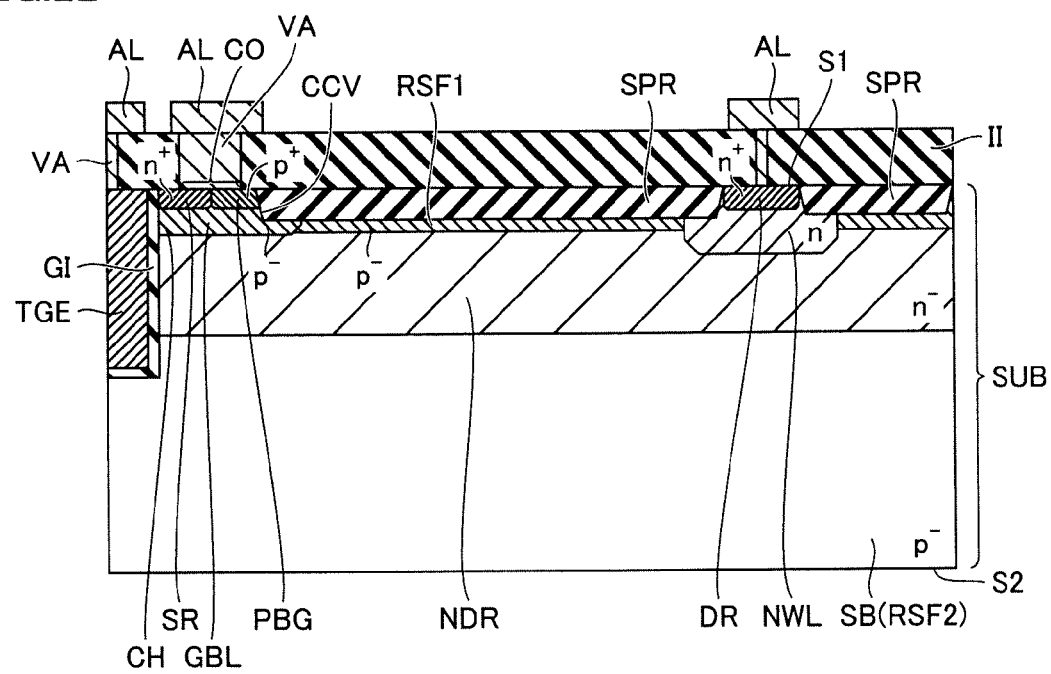
FIG. 22 is a schematic cross sectional view along a line XXII-XXII in FIG. 21.

Further, referring to FIGS. 21 and 22, in Variation 2 of the present embodiment, conductive layer (via) VA arranged on main surface S1 and connected to $p^+$ back gate region PBG, and conductive layer (via) VA arranged on main surface S1 and connected to both of $n^+$ source region SR and $p^+$ back gate region PBG are each formed like a slit. These conductive layers (vias) VA are arranged in the source-drain direction, side by side to be spaced from each other.

Each conductive layer (via) VA has a third contact CO3. Third contact CO3 extends in a direction intersecting with gate trench CH. Third contact CO3 is arranged to extend over $n^+$ source region SR and $p^+$ back gate region PBG arranged on the side closer to $n^+$ drain region DR with respect to $n^+$ source region SR, and is connected onto $n^+$ source region SR and $p^+$ back gate region PBG.

In Variation 2 of the present embodiment, since each conductive layer VA is formed like a slit, the contact area between conductive layers VA and $n^+$ source region SR and $p^+$ back gate region PBG can be increased. That is, the contact area between conductive layers VA and $n^+$ source region SR and $p^+$ back gate region PBG can be increased. Thus, resistances of second and third contacts CO3 to $n^+$ source region SR and $p^+$ back gate region PBG can be reduced.

Further, a width La of $p^+$ back gate region PBG as seen in a plan view is limited by the arrangement density of conductive layers (vias) VA when they are contact holes, whereas it is not limited by the arrangement density of conductive layers (vias) VA when they are slits.

Figure 23:
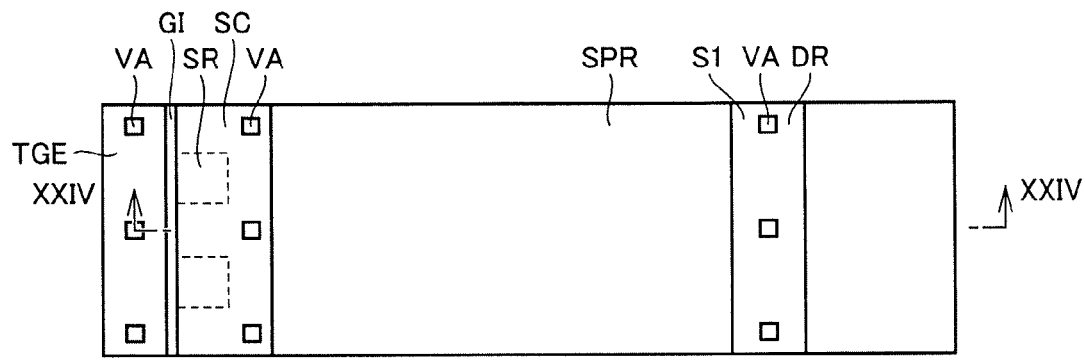
FIG. 23 is a schematic plan view showing a configuration of a first example of Variation 3 of the semiconductor device of Embodiment 1.
Figure 24:
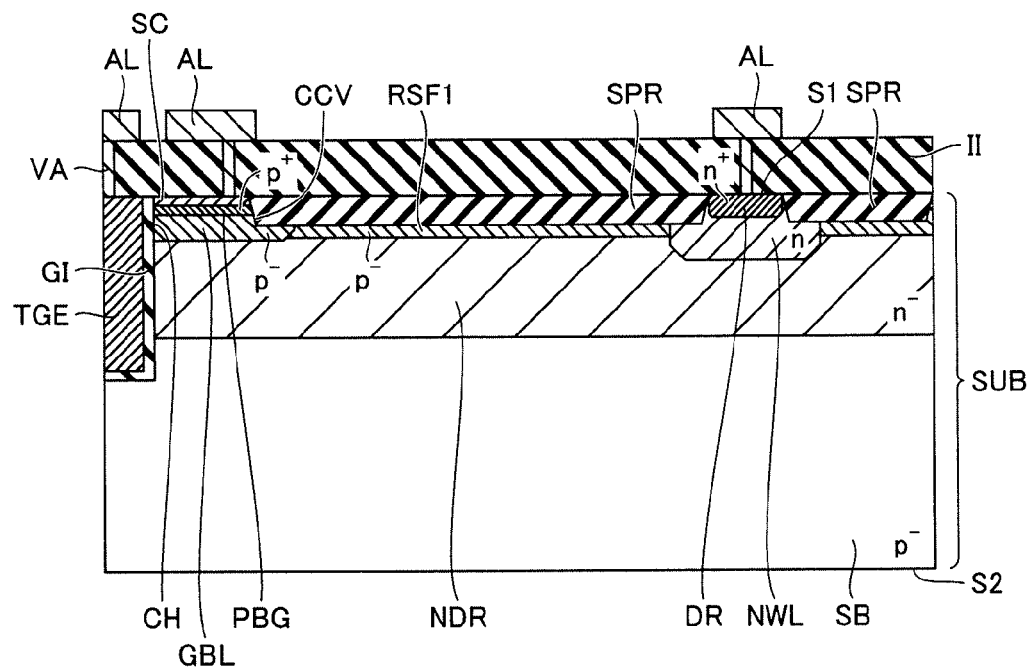
FIG. 24 is a schematic cross sectional view along a line XXIV-XXIV in FIG. 23.

Further, referring to FIGS. 23 and 24, in Variation 3 of the present embodiment, a silicide layer SC is formed. Silicide layer SC is a region where silicon reacts with a metal material. Silicide layer SC is arranged to extend over $n^+$ source region SR and $p^+$ back gate region PBG. That is, $n^+$ source region SR and $p^+$ back gate region PBG are adjacent to be in contact with each other relative to the direction of main surface S1, and silicide layer SC is formed to extend over both upper surfaces of $n^+$ source region SR and $p^+$ back gate region PBG. To an upper surface of silicide layer SC, vias VA are connected. In a first example of the present variation, each via VA is connected to silicide layer SC in a region above $p^+$ back gate region PBG. This via VA is shared by both $n^+$ source region SR and $p^+$ back gate region PBG.

In Variation 3 of the present embodiment, since $n^+$ source region SR and $p^+$ back gate region PBG are electrically connected by silicide layer SC, there is no need to arrange vias VA directly on if source region SR and $p^+$ back gate region PBG. Thus, vias VA can be electrically connected to $n^+$ source region SR and $p^+$ back gate region PBG through silicide layer SC. Thereby, layouts of $n^+$ source region SR and $p^+$ back gate region PBG are not limited by the layout of vias VA, and thus $n^+$ source region SR and $p^+$ back gate region PBG can be laid out with a higher density or with a smaller area.

Figure 25:
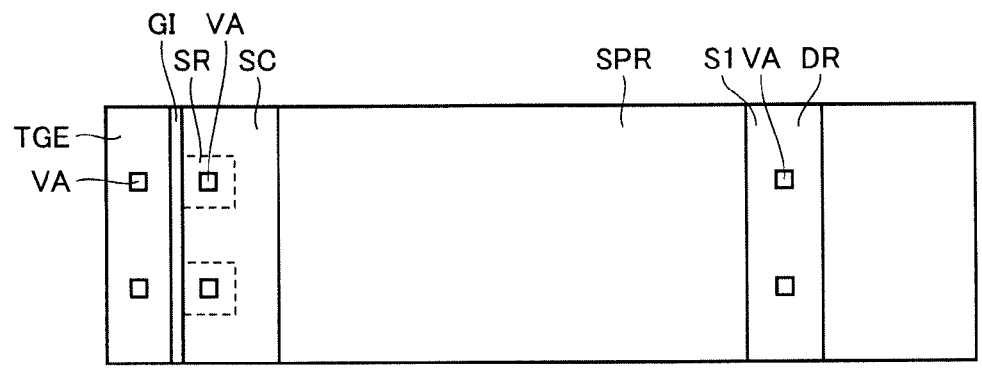
FIG. 25 is a schematic plan view showing a configuration of a second example of Variation 3 of the semiconductor device of Embodiment 1.
Figure 26:
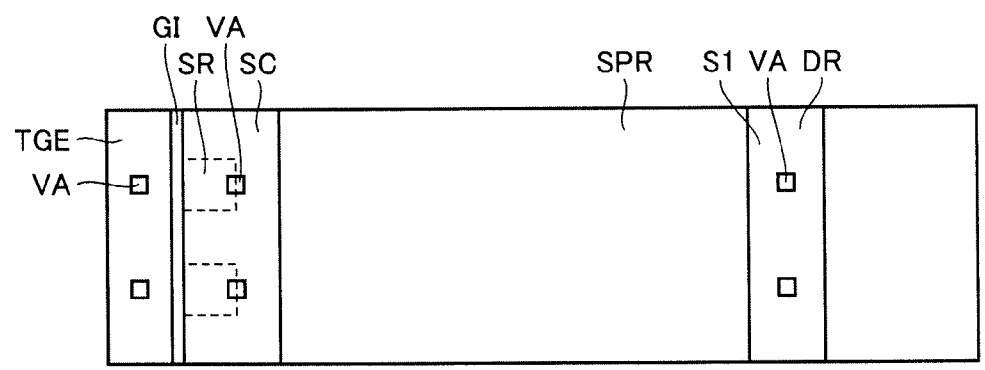
FIG. 26 is a schematic plan view showing a configuration of a third example of Variation 3 of the semiconductor device of Embodiment 1.

Therefore, although the case where each via VA is connected to silicide layer SC in the region above $p^+$ back gate region PBG has been described above as the first example of the present variation, referring to FIG. 25, each via VA may be connected to silicide layer SC in a region above $n^+$ source region SR, as shown in a second example of the present variation. Further, referring to FIG. 26, each via VA may be connected to silicide layer SC in a region extending over $n^+$ source region SR and $p^+$ back gate region PBG, as shown in a third example of the present variation.

Embodiment 2

A semiconductor device of Embodiment 2 is different from that of Embodiment 1 mainly in that it has a superjunction structure.

Figure 27:
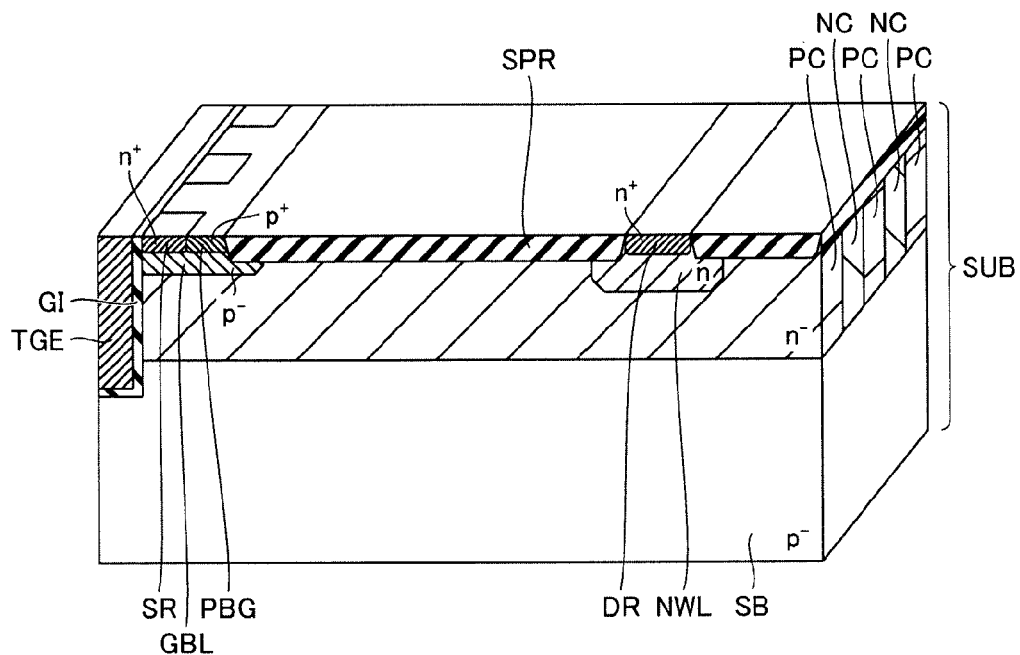
FIG. 27 is a schematic perspective view showing a configuration of a semiconductor device of Embodiment 2.

Referring to FIG. 27, in the present embodiment, a drain structure is configured as a superjunction structure. Specifically, N columns NC containing an n type impurity and P columns PC containing a p type impurity are formed within semiconductor substrate SUB to be in contact with the side closer to main surface S1 of $p^-$ substrate region SB. N columns NC and P columns PC are alternately arranged in the direction perpendicular to the source-drain direction. N columns NC and P columns PC are formed by performing multistage ion implantation on semiconductor substrate SUB. N columns NC and P columns PC are each formed to have a uniform impurity concentration from main surface S1 to a depth of about 3 µm. N columns NC and P columns PC are each formed to have a width and an impurity concentration which satisfy superjunction conditions.

It is noted that, other than that, the configuration in the present embodiment is substantially identical to the configuration in Embodiment 1, and thus identical elements will be designated by the same reference numerals and the description thereof will not be repeated (the same applies to the embodiments described below).

Since the semiconductor device of the present embodiment has a superjunction structure, an N column concentration is increased, and thus an ON resistance is reduced. Accordingly, a reduction in an on-state breakdown voltage due to a parasitic bipolar operation tends to occur, but the on-state breakdown voltage can be improved by reducing the parasitic bipolar operation by the $p^+$ back gate region.

Figure 28:
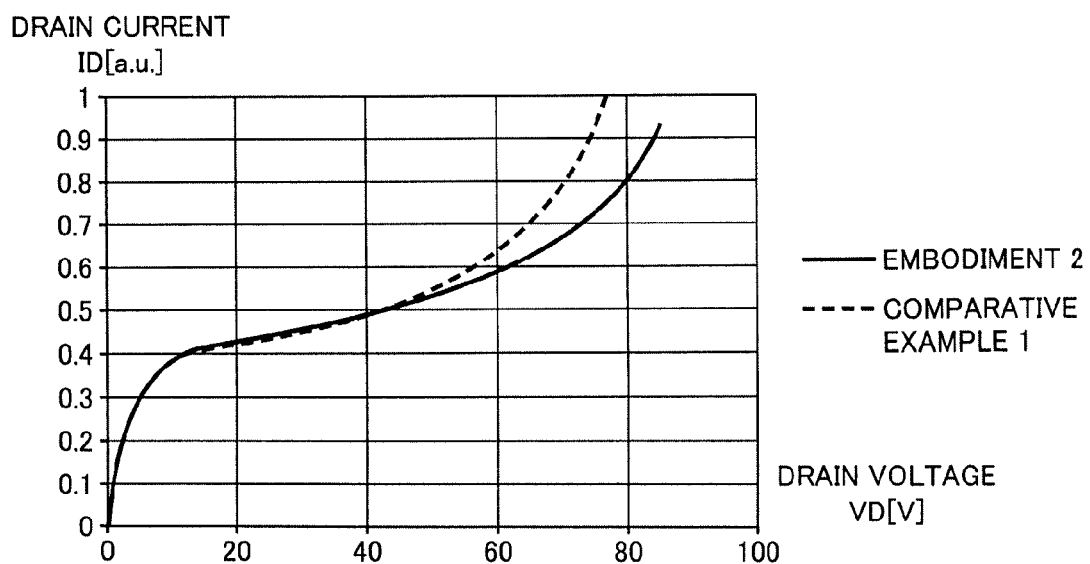
FIG. 28 is a view comparing waveforms of on-state breakdown voltages in Embodiment 2 and Comparative Example 1.

Referring to FIG. 28, waveforms of on-state currents in Comparative Example 1 of Embodiment 1 and in the present embodiment are compared. In the present embodiment, since an effective source W length is different, a gate voltage is set higher and a channel resistance is equalized to match a saturation current obtained when a drain voltage is low, for comparison. As a result, in the present embodiment, an increase in a drain current which depends on the drain voltage is suppressed even when the drain voltage is more than 80 V, and the on-state breakdown voltage is improved, as compared with Comparative Example 1.

Embodiment 3

A semiconductor device of Embodiment 3 is different from that of Embodiment 1 mainly in that a semiconductor substrate is an SOI (Silicon On Insulator).

Figure 29:
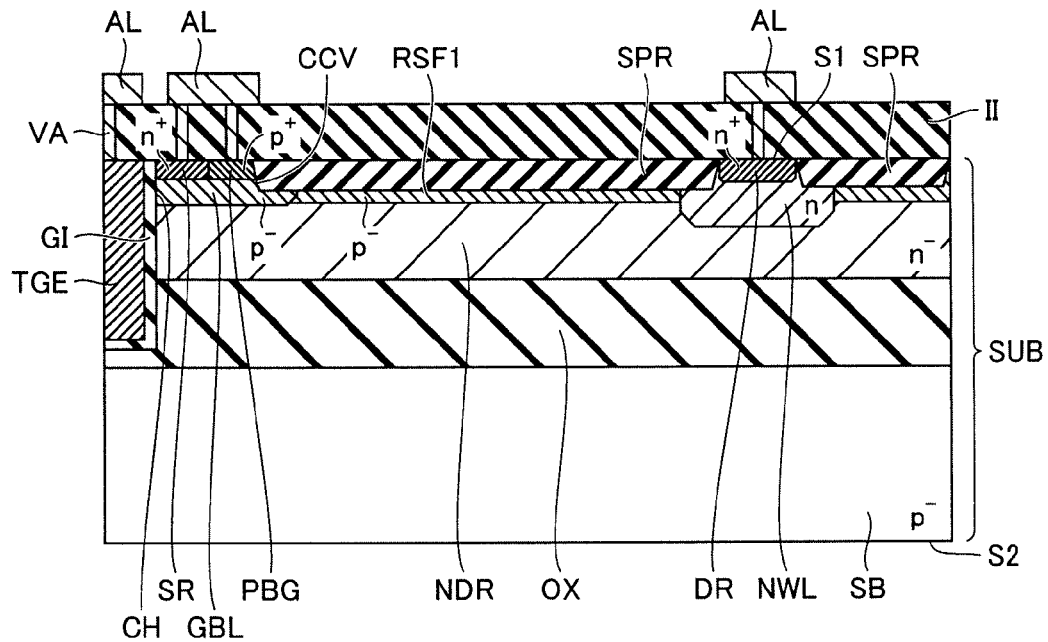
FIG. 29 is a view showing a configuration of a semiconductor device of Embodiment 3, and a schematic cross sectional view corresponding to FIG. 2.
Figure 30:
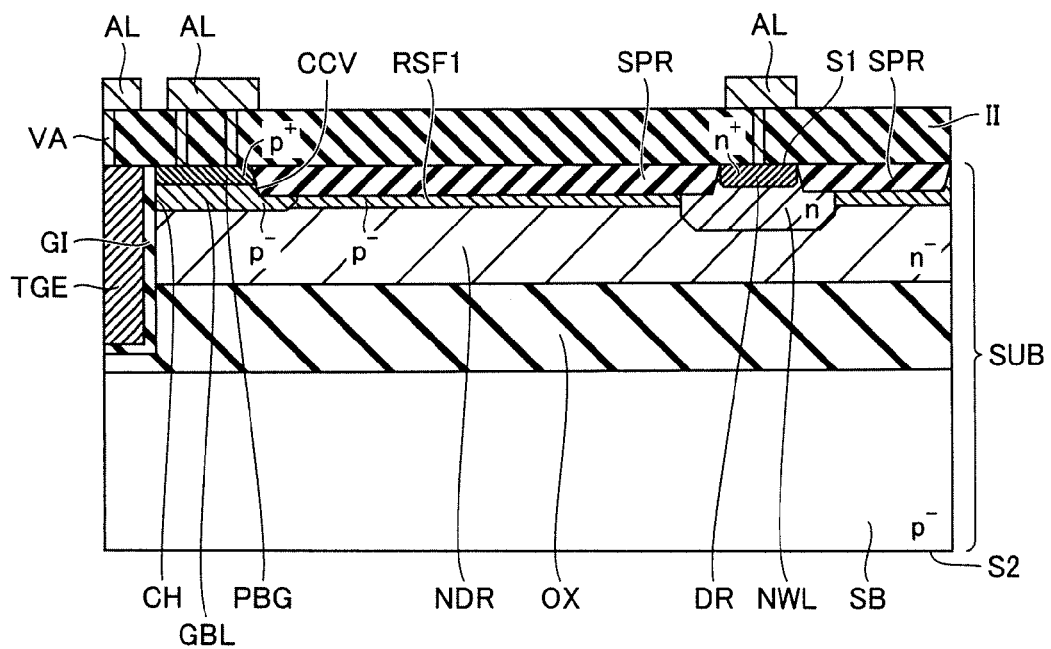
FIG. 30 is a view showing the configuration of the semiconductor device of Embodiment 3, and a schematic cross sectional view corresponding to FIG. 3.

Referring to FIGS. 29 and 30, in the semiconductor device of the present embodiment, an insulating layer OX is formed to be in contact with the side closer to the other main surface S2 of $n^-$ drift region (drift region) NDR. Insulating layer OX is made of, for example, a silicon oxide film, and preferably has a thickness of more than or equal to 0.1 µm and less than or equal to 2 µm. Further, trench gate electrode TGE (gate trench CH) extending from main surface S1 of semiconductor substrate SUB in the up-down direction in the drawing reaches at least $n^-$ drift region NDR, and is preferably formed to reach insulating layer OX.

By using an SOI for semiconductor substrate SUB, the LDMOS transistor portion is separated from p⁻ substrate region SB by insulating layer OX. Thereby, the LDMOS transistor portion can also be used as a high side transistor, and interference with other regions can also be prevented.

Embodiment 4

A semiconductor device of Embodiment 4 is different from that of Embodiment 1 in that it is a lateral IGBT (Insulated Gate Bipolar Transistor).

Figure 31:
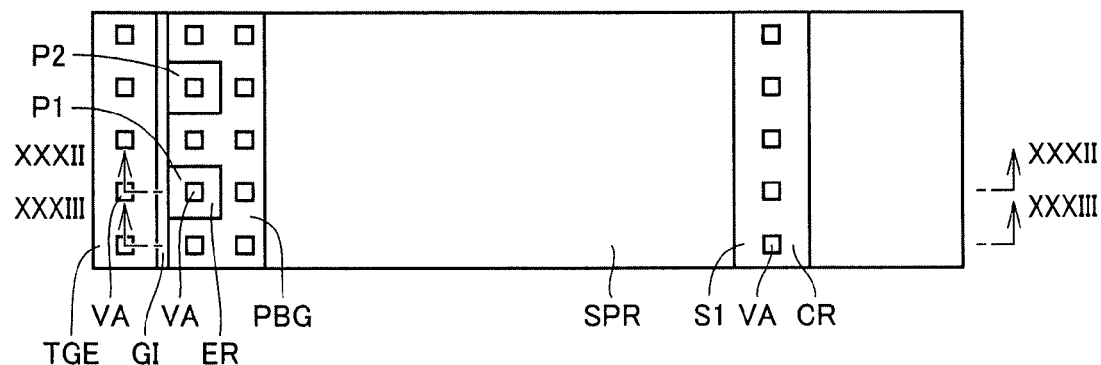
FIG. 31 is a schematic plan view showing a configuration of a semiconductor device of Embodiment 4.
Figure 32:
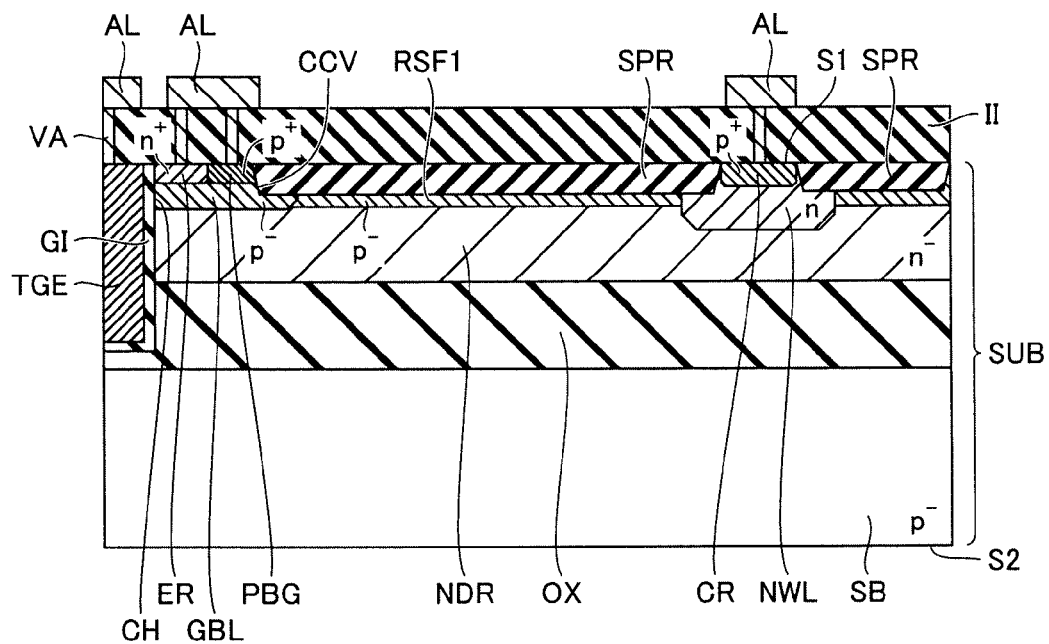
FIG. 32 is a schematic cross sectional view along a line XXXII-XXXII in FIG. 31.
Figure 33:
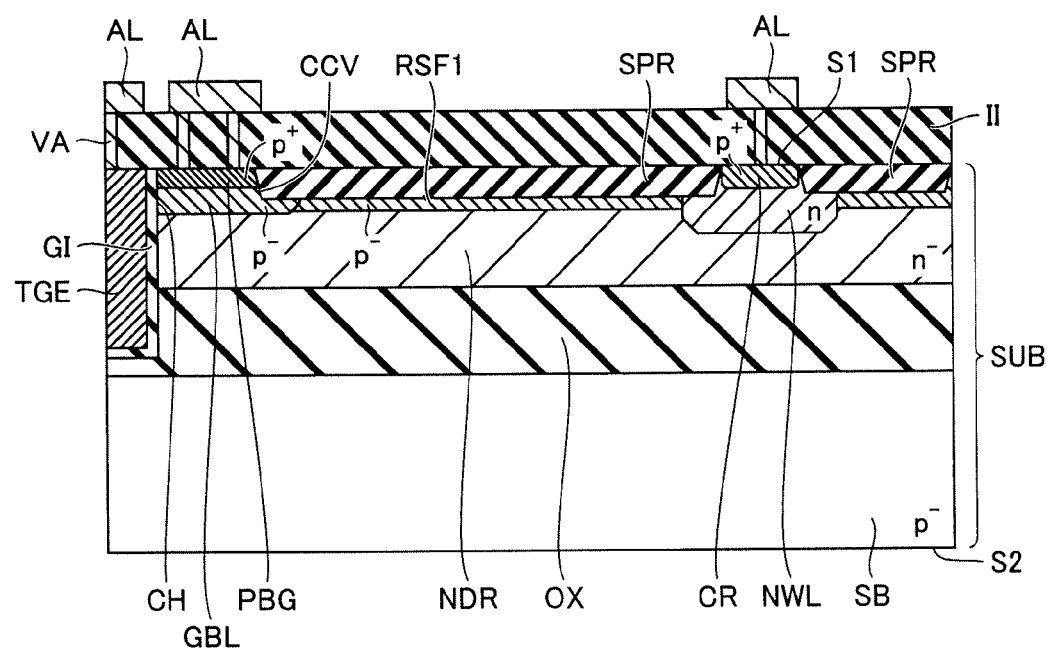
FIG. 33 is a schematic cross sectional view along a line XXXIII-XXXIII in FIG. 31.

Referring to FIGS. 31 to 33, specifically, a region corresponding to the n⁺ source region in Embodiment 1 is configured as an n⁺ emitter region (a first impurity region which serves as an emitter) ER, and a region corresponding to the n⁺ drain region in Embodiment 1 is configured as a p⁺ collector region (a second impurity region of the second conductivity type which serves as a collector) CR. Further, the semiconductor device of Embodiment 4 is also different from that of Embodiment 1 in that a semiconductor substrate is an SOI.

Also in the semiconductor device of the embodiment, since p⁺ back gate region PBG is arranged in main surface S1 between first and second portions P1, P2 of n⁺ emitter region ER, and arranged on a side closer to p⁺ collector region CR with respect to n⁺ emitter region ER, an on-state breakdown voltage can be improved by reducing a parasitic bipolar operation by p⁺ back gate region PBG.

Although the invention made by the present inventor has been specifically described based on the embodiments, it is needless to say that the present invention is not limited to the embodiments described above and can be variously modified within a scope not departing from the purport thereof.

REFERENCE SIGNS LIST

AL: metal wire; CCV: concave portion; CH: gate trench; CO1: first contact; CO2: second contact; CR: p⁺ collector region, DR: n⁺ drain region; ER: n⁺ emitter region; GBL: p⁻ body region; GE: gate electrode; GI: gate insulating film; II: interlayer insulating film; MSK: mask pattern; NC: N column; NDR: n⁻ drift region; NWL: n type well region; OX: insulating layer; PC: P column; P1: first portion; P2: second portion; PBG: p⁺ back gate region; RSF1: first resurf region; RSF2: second resurf region; SB: p⁻ substrate region; SC: silicide layer; SPR: separation insulating film; SR: n⁺ source region; SUB: semiconductor substrate; TGE: trench gate electrode; VA: via.

The invention claimed is:

1. A semiconductor device having a lateral insulated gate field effect transistor portion, comprising:
a semiconductor substrate having a main surface and a trench formed in said main surface;
a gate electrode of said insulated gate field effect transistor portion embedded within said trench in said semiconductor substrate;
a first impurity region of a first conductivity type which has first and second portions separated from each other along said trench in said main surface, and serves as a source or an emitter;
a second impurity region which is arranged in said main surface on a side of the first impurity region opposite to said trench, and serves as a drain of the first conductivity type or a collector of a second conductivity type; and
a back gate region of the second conductivity type which is arranged in said main surface between said first and second portions of the first impurity region, and arranged between said second impurity region and said first and second portions of said first impurity region.

2. The semiconductor device according to claim 1, wherein said back gate region surrounds said first impurity region except for a region where said first impurity region faces said gate electrode.

3. The semiconductor device according to claim 1, further comprising a conductive layer which is arranged over the main surface and electrically connected to said first impurity region and said back gate region,
wherein said conductive layer includes:
a first contact which is arranged along said trench to extend over said first and second portions, and connected to said first and second portions and said back gate region, and
a second contact which is arranged over the back gate region along said first contact, on a side of the first contact opposite to said trench, and connected to said back gate region.

4. The semiconductor device according to claim 1, further comprising a conductive layer which is arranged over the main surface and electrically connected to said first impurity region and said back gate region,
wherein said conductive layer includes a third contact which extends in a direction intersecting with said trench in said main surface, is arranged to extend over said first impurity region and said back gate region, and is connected to said first impurity region and said back gate region.

5. The semiconductor device according to claim 1, further comprising a silicide layer which is arranged in said main surface to extend over said first impurity region and said back gate region.

6. The semiconductor device according to claim 1, further comprising:
a drift region of the first conductivity type which is arranged within said semiconductor substrate; and
a first resurf region of the second conductivity type which is in contact with a side of the drift region closest to said main surface of said semiconductor substrate.

7. The semiconductor device according to claim 6, further comprising a second resurf region of the second conductivity type which is in contact with a side of said drift region opposite to the side contacting said first resurf region.

8. The semiconductor device according to claim 1, further comprising:
a separation insulation film extending along the main surface in a region between the first impurity region and the second impurity region,
wherein only the back gate region is disposed in the main surface between the first impurity region and the separation insulation film along a direction from the first impurity region to the second impurity region.

9. The semiconductor device according to claim 8, wherein the back gate region is in contact with the first impurity region and the separation insulation film.

10. The semiconductor device according to claim 1, wherein the back gate region has an impurity density that varies in a thickness direction of the semiconductor substrate.

11. The semiconductor device according to claim 1, further comprising:
a first body region of the second conductivity type formed in the semiconductor substrate and in contact with both the first impurity region and the back gate region;

a first well region of the first conductivity type formed in the semiconductor substrate and in contact with the second impurity region; and a first resurf region of the second conductivity type extending between and in contact with the first body region and the first well region.

12. The semiconductor device according to claim 11, further comprising a separation insulation film formed over the first resurf region and in contact with the back gate region, the first body region, the first well region, and the second impurity region.

13. The semiconductor device according to claim 1, further comprising:

an interlayer insulating film formed over the main surface of the semiconductor substrate and having first vias extending therethrough to the first impurity region and second vias extending therethrough to the back gate region; and a conductive layer formed over the interlayer insulating film and electrically connected to both the first impurity region and the back gate region by the first and second vias, respectively, wherein the first impurity region is in contact with the back gate region.

14. The semiconductor device according to claim 1, further comprising:

a first contact disposed over the main surface of the semiconductor substrate, extending in a direction crossing a direction of extension of the trench, and electrically connected to the first portion of the first impurity region and the back gate region by a first via;

a second contact disposed over the main surface of the semiconductor substrate, spaced from the first contact, extending in the direction crossing the direction of extension of the trench, and electrically connected to the second portion of the first impurity region and the back gate region by a second via; and a third contact disposed over the main surface of the semiconductor substrate, between and spaced from the first and second contacts, extending in the direction crossing the direction of extension of the trench, and electrically connected to the back gate region by a third via.

* * * * *